(12) United States Patent
Oggioni

(10) Patent No.: US 7,783,998 B2
(45) Date of Patent: Aug. 24, 2010

(54) METHOD AND SYSTEM FOR PROTOTYPING ELECTRONIC DEVICES WITH MULTI-CONFIGURATION CHIP CARRIERS

(75) Inventor: Stefano Sergio Oggioni, Milan (IT)

(73) Assignee: International Business Machines Corporation, Armonk, NY (US)

( * ) Notice: Subject to any disclaimer, the term of this patent is extended or adjusted under 35 U.S.C. 154(b) by 464 days.

(21) Appl. No.: 11/780,919

(22) Filed: Jul. 20, 2007

(65) Prior Publication Data

US 2008/0209378 A1    Aug. 28, 2008

(30) Foreign Application Priority Data

Jul. 20, 2006    (EP) .................................. 06117531

(51) Int. Cl.
*G06F 17/50* (2006.01)

(52) U.S. Cl. .................. 716/4; 716/5; 716/10
(58) Field of Classification Search ...... 716/1, 716/4, 5, 8, 10; 439/267
See application file for complete search history.

(56) References Cited

U.S. PATENT DOCUMENTS

| 5,172,303 | A | * | 12/1992 | Bernardoni et al. | ......... 361/744 |
| 5,537,108 | A | * | 7/1996 | Nathan et al. | ................ 257/529 |
| 5,572,409 | A | * | 11/1996 | Nathan et al. | ................ 361/806 |
| 5,808,351 | A | * | 9/1998 | Nathan et al. | ................ 257/528 |
| 5,813,881 | A | * | 9/1998 | Nathan et al. | ................ 439/516 |
| 6,902,951 | B2 | * | 6/2005 | Goller et al. | ................ 438/106 |

* cited by examiner

*Primary Examiner*—Sun J Lin
(74) *Attorney, Agent, or Firm*—Joseph Petrokaitis

(57) ABSTRACT

A solution for prototyping electronic devices is proposed. The solution uses a carrier which allows mounting the desired components with different configurations. In order to achieve this result, for some of these components, such as discrete capacitors, the carrier includes more contacts than the corresponding terminals. In this way, each capacitor may be mounted in multiple positions (such as a working one based on the manufacturing standards, an advanced one with gaps between the components below the corresponding safety margins, and as control one with larger gaps). As a result, it is possible to assemble different prototypes by using a single type of carrier, thereby substantially reducing the cost of the process.

11 Claims, 10 Drawing Sheets

METHOD AND SYSTEM FOR PROTOTYPING ELECTRONIC DEVICES WITH MULTI-CONFIGURATION CHIP CARRIERS

FIELD OF THE INVENTION

The present invention relates to the electronic field. More specifically, the invention relates to the prototyping of electronic devices.

BACKGROUND OF THE INVENTION

The development of electronic devices (or packages) is a very complex process. Typically, each device is formed by one or more integrated circuits mounted on a chip carrier. The chip carrier consists of a circuitized insulating substrate, which protects the integrated circuits from mechanical stresses and implements the required electrical connections.

In this context, several mechanical factors affect the design of the device (such as the thickness of the carrier to ensure the desired stiffness and to allow realizing the required interconnection vias through it, the possible addition of a stiffener for preventing any warp of the carrier, and the like).

Additional problems are due to the presence of multiple integrated circuits on the same carrier (generating asymmetric stresses that may involve an irregular warping of the carrier). The scenario is further complicated when discrete elements (such as capacitors or resistors) are also mounted on the carrier.

In the case of a multi-component device, a minimum gap must be ensured between each pair of adjacent components (i.e., integrated circuits or discrete elements). For example, this is necessary to allow mounting each component in the desired position (without any interference of a corresponding mounting head with the adjacent components), or to allow inserting a dispensing needle close to each integrated circuit for its underfilling. Moreover, the same gap is necessary to allow heating each (low cost) discrete element locally for removing and replacing it when defective (during a reworking of the device aimed at saving the far more expensive integrated circuits).

The position of the components on the carrier is also of the utmost importance for the reliability of the device. Indeed, it is necessary to ensure that any joints between the components and the carrier maintain their integrity, or that they remain correctly insulated (without any short circuit being created, for example, by ionic contamination, electro-migration or dendritic growth). This involves further constraints to the minimum gaps between the components. The problem is particularly acute for the discrete elements, since the integrity and the insulation of their joints strongly depends on the proximity of the stiffener or of the (larger) integrated circuits.

In any case, it is always necessary to test any new device for verifying whether it exhibits the desired features. Particularly, in the scenario at issue the test is aimed at verifying the reliability of the device (i.e., the integrity and the insulation of the joints) against mechanical and/or thermal stresses.

For this purpose, prototyping techniques are commonly used to validate the device before its actual production. A prototype consists of a physical implementation of the device (possibly simplified in some aspects not relevant to the test of interest). For example, a routing structure of the carrier is simplified by simply implementing the desired accesses to the components (without any or controlled interconnections among them). Moreover, the prototype typically replaces the real components (especially the integrated circuits in bare die format) with dummy ones known as superchips. Each superchip is dimensionally identical to the corresponding (real) integrated circuit, but with special electrical circuits that replace its application functional circuitry. For example, some terminals of the superchip are short-circuited to each other within the component.

This ensures an electrical continuity between each pair of short-circuited terminals, so as to generate a conductive path that allows measuring electrical quantities of desired patterns passing through it.

A drawback of the solutions known in the art is that they are quite rigid. Indeed, any prototyping carrier only allows testing a specific configuration of the device (with its components in specific positions).

Therefore, the device is generally designed with a conservative configuration that is likely to meet the desired reliability requirements (e.g., based on manufacturing standards commonly accepted). However, this does not allow investigating more aggressive designs (wherein the gaps between the components are further reduced below the safety margins of the manufacturing standards).

This has a detrimental impact on the whole size of the device, since it prevents the design of more compact structures (wherein the gaps between the components are actually minimized).

SUMMARY OF THE INVENTION

In its general terms, the present invention is based on the idea of providing a carrier allowing multiple configurations of the prototypes.

More specifically, an aspect of the invention proposes a method for prototyping an electronic device. The method includes the steps of providing at least one circuitized insulating carrier having a plurality of sets of contacts for electrically connecting terminals of corresponding electronic components for at least a selected one of the components, the corresponding contacts being more than the terminals of the selected component. The method includes the step of assembling a plurality of prototypes of the device by mounting the components on the at least one carrier, the prototypes having a plurality of configurations each one defined by a position of the terminals of each selected component on the corresponding contacts. The method further includes the step of measuring operative parameters of each prototype through the contacts being connected to the terminals of the at least one selected component.

Typically, the obtained results are used to select a configuration for the manufacturing of the electronic device.

In a preferred embodiment of the invention, for each selected component one or more measuring sets of contacts are connected to common access point(s) of the carrier (such as bumps).

Advantageously, each selected component includes one or more sets of short-circuited terminals (connected to pairs of measuring sets of contacts in each position).

For example, the proposed solution may be used to perform resistance tests (for example, according to a four-probe measuring technique with a good approximation to the construction of a four terminal Cross Bridge Kelvin Resistor).

In addition or in alternative, the same solution may be used to perform insulation tests.

Preferably, the proposed solution is applied to components having two rows of terminals.

For example, these components consist of discrete elements (such as capacitors).

In a specific implementation of the invention, the (resistance) tests are applied to the edge contacts.

In another implementation of the invention, the (insulation) tests are instead applied to all the contacts.

Another aspect of the invention proposes a circuitized insulating carrier for use in the method.

BRIEF DESCRIPTION OF THE DRAWINGS

The invention itself, as well as further features and the advantages thereof, will be best understood with reference to the following detailed description, given purely by way of a non-restrictive indication, to be read in conjunction with the accompanying drawings.

In this respect, it is expressly intended that the figures are not necessary drawn to scale and that, unless otherwise indicated, they are merely intended to conceptually illustrate the structures and procedures described herein.

DETAILED DESCRIPTION OF EMBODIMENTS OF THE INVENTION

Figure 1A:
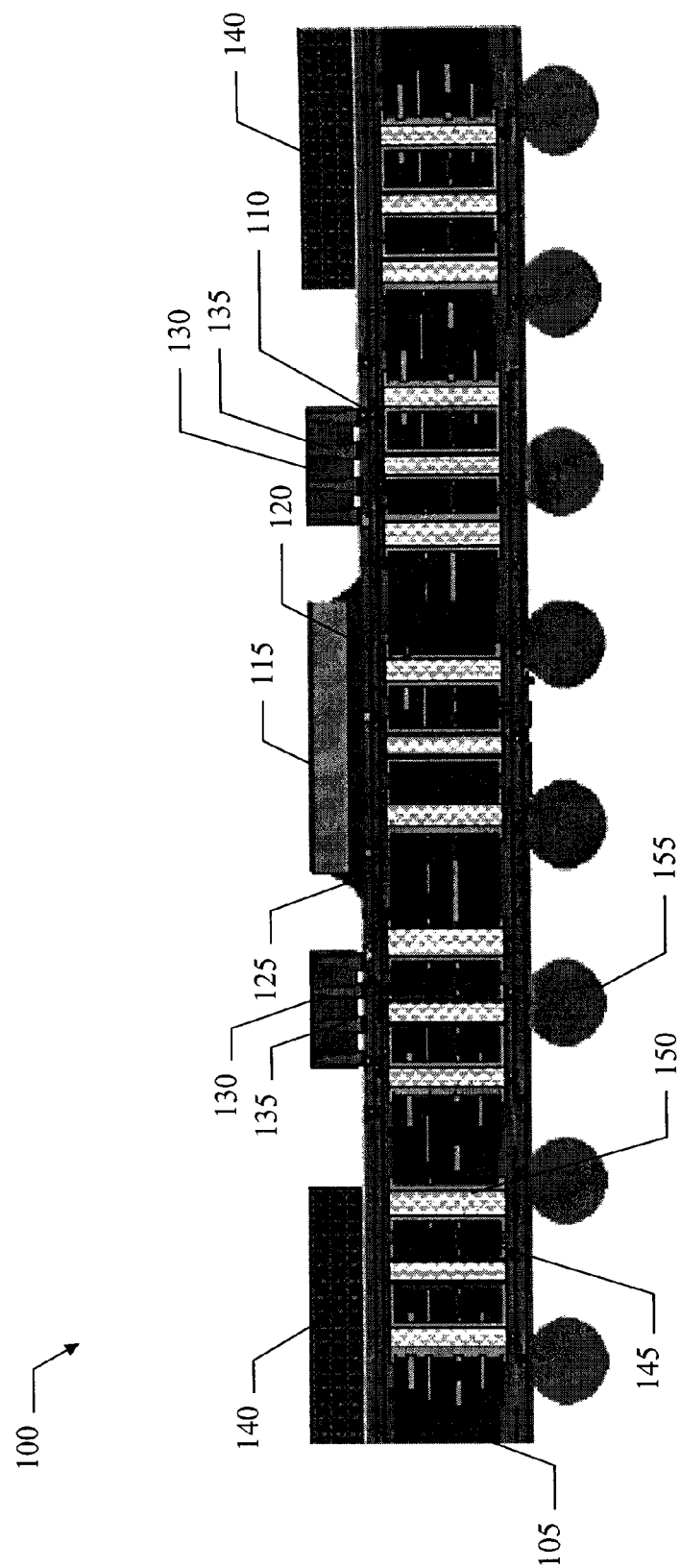
FIGS. 1a and 1b show a cross-section side view and an elevation view, respectively, of an exemplary electronic device.
Figure 1B:
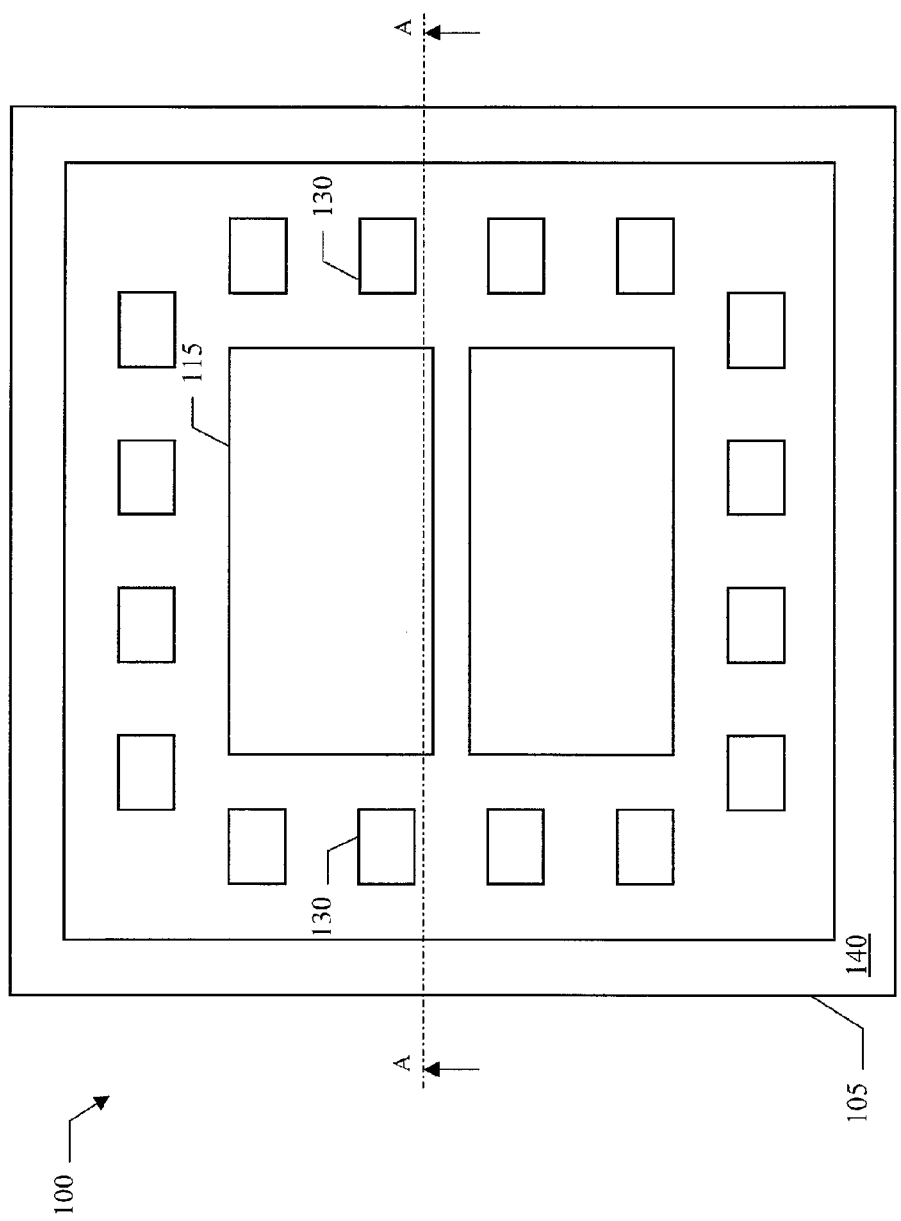

With reference in particular to FIGS. 1a and 1b, an electronic device 100 of the Flip Chip Plastic Ball Grid Array (FCPBGA) type is illustrated. Particularly, FIG. 1a shows the device 100 in cross-section side view. FIG. 1b shows the same device 100 in elevation view (with the cross-section of the FIG. 1a that is taken along a plane AA of FIG. 1b).

The device 100 includes multiple electronic components, which are usually mounted on the top (upper) surface of a chip carrier 105. The carrier 105 consists of a circuitized insulating substrate (for example, with a square shape having sides of the order of 5-10 mm and a thickness of the order of 0.5-2.0 mm). The top surface of the carrier 105 is provided with conductive pads 110 (such as some thousands) for mechanically and electrically connecting the components mounted thereon.

Particularly, the components of the device 100 include a few integrated circuits 115 (two in the example at issue), which are realized in corresponding chips of semiconductor material. Each integrated circuit 115 is mounted on the carrier 105 with a flip-chip technique. For this purpose, a front (lower) surface of the integrated circuit 115 is provided with a matrix of I/O terminals 120 in the form of bumps (e.g., ranging from a few hundreds to a few thousands). The front surface of the integrated circuit 115 faces the top surface of the carrier 105, with the terminals 120 that are directly soldered to corresponding pads 110. An underfiller 125 (such as an epoxy resin) is interposed between the integrated circuit 115 and the carrier 105 (so as to improve their mechanical connection and compensate the different coefficient of thermal expansion).

The components of the device 100 further include some tens of discrete elements 130, such as ceramic capacitors or resistors (twelve in the example at issue). Each discrete element 130 is provided with two lines of I/O terminals 135 in the form of metal contacts (for example, 3–10×2=6–20). The terminals 135 barely protrude from a bottom (lower) surface of the discrete element 130 along opposite side surfaces of its body. As above, the bottom surface of the discrete element 130 faces the top surface of the carrier 105, with the terminals 135 that are directly soldered to corresponding pads 110. It should be noted that the above-mentioned terminals 135 are leadless (i.e., without any real bearing structure), so that their stress resistance is particularly critical.

Typically, a stiffener 140 is mounted on the top surface of the carrier 105. For example, the stiffener 140 consists of a rigid frame, which is arranged along an edge of the carrier 105. The stiffener 140 reduces any warping of the carrier 105 at the working temperature of the device 100 (i.e., at room temperature), due to its shrinking resulting from the choice of having a zero-stress condition at high temperature (such as 120°-180°) to allow the correct mounting of the components 115,130.

The carrier 105 is provided with one or more layers of conductive tracks 145 (separated by means of thin dielectric layers). Tracks 145 are connected to the pads 110 for routing electrical signals and/or power supply voltages (typically in the form of planes in the latter case). The tracks 145 are in turn connected to vias 150 (consisting of plated through holes crossing the whole thickness of the carrier 105). Other smaller vias (not shown in the figure) are created by laser drilling and plating processes. These smaller vias are used to cross the dielectric layers, thereby connecting the (larger) vias 150 to the outer surfaces of the carrier 105. Each via 150 connects the corresponding track(s) 145 to an interconnection ball 155 formed on a bottom (lower) surface of the carrier 150 (opposite its top surface wherein the components 115,130 are mounted). The balls 155 define the I/O terminals of the device 100, which are used as access points for interfacing the device 100 with the outside world. The device 100 so obtained is typically mounted on a Printed Circuit Board (PCB), not shown in the figure, by soldering its terminals 155 onto corresponding metal tracks.

Figure 2:
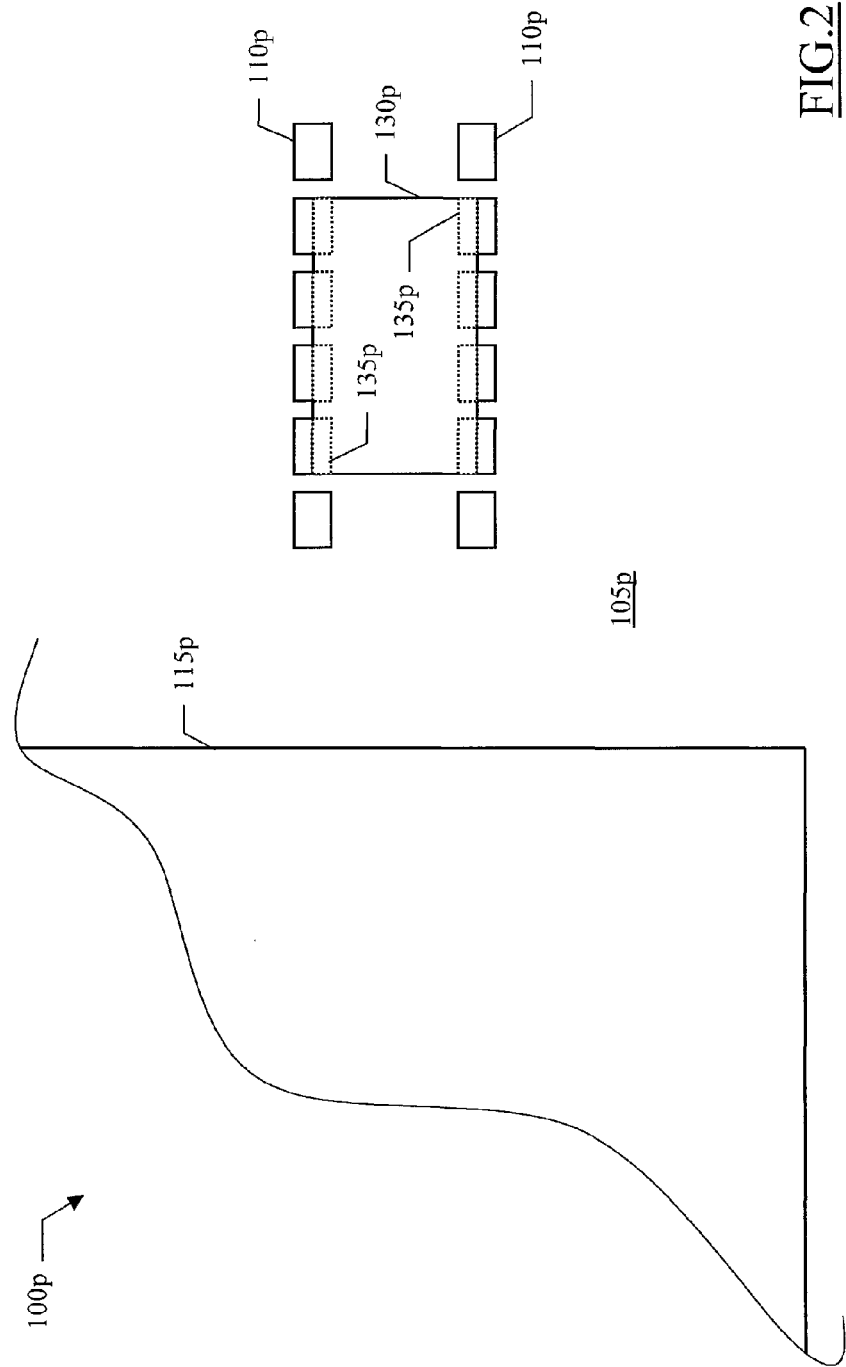
FIG. 2 shows an enlarged prototype of this electronic device according to an embodiment of the invention.

Moving now to FIG. 2, during the development of the above-described device, prototypes thereof are used for testing its reliability (in the following, each prototype and its elements will be denoted with the same references used in the foregoing, simply differentiated by adding the suffix "p"). For example, FIG. 2 shows a prototype 100p based on a carrier 105p wherein the desired components 115p,130p are mounted by means of corresponding pads 110p. The components 115p,130p have subsets of measuring terminals (such as the terminals 135p shown in FIG. 2), which are short-circuited to each other within the components 115p,130p themselves. Generally, this condition is already fulfilled by most discrete elements 130p, whereas the same result is achieved for the integrated circuits 115p by replacing them with suitable superchips (i.e., dummy components with no internal logic). Moreover, the carrier 105p is simplified only providing the connections of its terminals on the back surface, not shown in FIG. 2, to some (measuring) pads 110p on the bottom surface for the above-mentioned measuring terminals 135p (without implementing the actual routing of the signals and/or the power supply voltages in the layers of its conductive tracks).

In the solution according to an embodiment of the present invention, the pads 110p for some of the components 115p, 130p are in a number higher than the one of the corresponding terminals 135p. For example, as shown in FIG. 2, 12 pads 110p are provided for a discrete element 130p having 8 terminals 135*p*. In this way, the discrete element 130*p* may be mounted on the carrier 105*p* in different positions (such as centered as shown in FIG. 2, shifted to the left or shifted to the right). As described in detail in the following, in every position the measuring terminals 135*p* of the discrete element 130*p* (or at least part of them) may be accessed through some of the associated measuring pads 110*p*.

The proposed solution strongly increases the flexibility of the prototyping process. Indeed, multiple prototypes can be realized (with corresponding configurations of the components arranged in different positions) by means of common carriers.

It is emphasized that this result may be achieved in a cost effective way, since the design (and the realization) of a single carrier is required for all the desired configurations of the prototypes.

This allows investigating alternative configurations (in addition to the one based on the manufacturing standards). For example, it is possible to test more aggressive designs (wherein the gaps between the components are further reduced below the safety margins of the manufacturing standards).

All of the above has a beneficial impact on the whole size of the device, since it permits to design more compact structures (wherein the gaps between the components are actually minimized).

Figure 3:
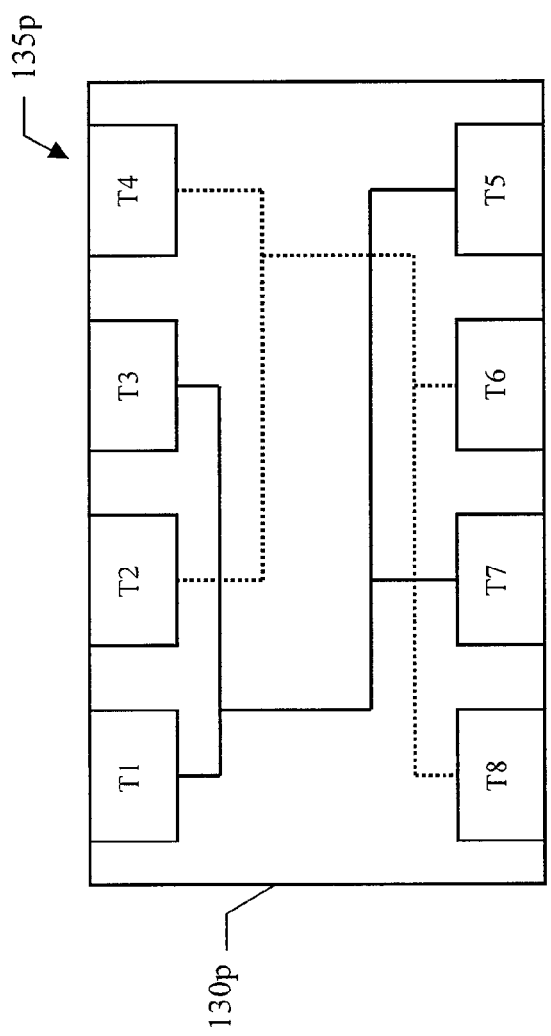
FIG. 3 is a schematic representation of a discrete element that may be included in the device.

With reference now to FIG. 3, the proposed solution is preferably applied to the discrete elements 130*p* only. Indeed, those components 130*p* have a reduced number of terminals, and they are typically mounted at the periphery of the carrier, i.e., far away from its (central) zero-stress point. Particularly, in order to explain exemplary applications of the above-described solution reference will be made in the following to a discrete element 130*p* consisting of a Multi Interdigitated Low Inductance Capacitor (MTLIC). The capacitor 130*p* is provided in a Dual In-line Package (DIP), having a rectangular shape and 8 terminals 135*p* that are arranged in two parallel rows along the longer sides thereof. The terminals 135*p* are individually referred to as Ti (with i=1-8). Particularly, the terminals T1-T4 run along an upper row (from the left to the right), and the terminals T5-T8 run along a lower row (from the right to the left).

Half the terminals 135*p* are connected to a first set of plates of the capacitor 130*p*, whereas the other half terminals 135*p* are connected to a second set of plates thereof (so as to further reduce the inductance of the component). The odd terminals T1, T3, T5 and T7 provide an access to the first set of plates (being short-circuited to each other within the capacitor 130*p* as schematically indicated by a solid line). Likewise, the even terminals T2, T4, T6 and T8 provide an access to the second set of plates (being short-circuited to each other within the capacitor 130*p* as schematically indicated by a dotted line).

Figure 4:
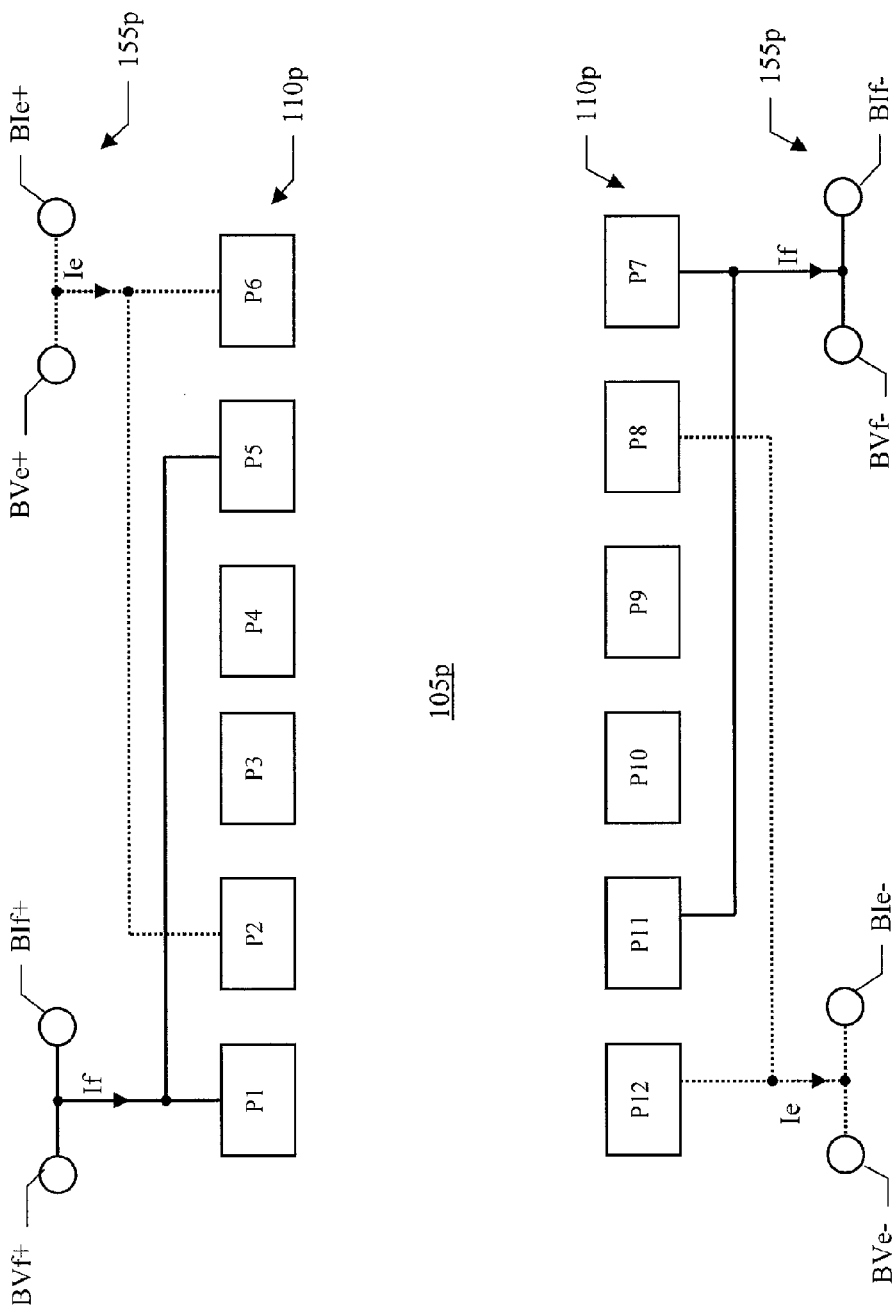
FIG. 4 shows a detail of a carrier of the prototype according to an embodiment of the invention.

Continuing to FIG. 4, in an embodiment of the present invention the proposed prototype is used to test the integrity of some joints between the terminals of each capacitor and the corresponding pads 110*p*, by means of a four-probe measuring technique.

For this purpose, the carrier 105*p* is provided with 12 pads 110*p* for the 8 terminals of the capacitor, which pads 110*p* are arranged in two similar parallel rows. The pads 110*p* are individually referred to as Pj (with j=1-12). Particularly, the terminals P1-P6 run along an upper row (from the left to the right), and the terminals P7-P12 run along a lower row (from the right to the left). In the upper row, the first pad P1 and the last but one pad P5 are connected to two common terminals 155*p* on the back surface of the carrier 105*p*, individually referred to as BVf+ and BIf+ (being short-circuited to each other within the carrier 105*p* as schematically indicated by a solid line).

Symmetrically, the last pad P6 and the second pad P2 are connected to two other common terminals 155*p* on the back surface of the carrier 105*p*, individually referred to as BVe+ and BIe+ (being short-circuited to each other within the carrier 105*p* as schematically indicated by a dotted line). Likewise, in the lower row the pads P7 and P11 are connected to two common terminals 155*p*, individually referred to as BVf− and BIf− (being short-circuited to each other as schematically indicated by a further solid line). Moreover, the pads P12 and P8 are connected to two common terminals 155*p*, individually referred to as BVe− and BIe− (being short-circuited to each other as schematically indicated by a further dashed line).

During the test of the prototype, a current If (for example, of some μA) is injected into the terminal Bif+. When one of the corresponding pads P1 or P5 is short-circuited (within the capacitor mounted thereon) to one of the pads P7 or P11 on the other row, the same current If is sunk from the corresponding terminal BIf−. A voltage Vf measured between the associated terminals BVf− and BVf+ (along the same path followed by the current If) allows calculating a resistance Rf=Vf/If of this path. Therefore (disregarding the resistance of the tracks connecting the pads 110*p* to the terminals 155*p*, and the internal resistance of the capacitor), the resistance Rf can be considered equal to the one of the two crossed joints (between the terminals of the capacitor and the relevant pads P1/P5 and P7/P11). It is therefore possible to identify any failure of these joints when their resistance Rf drifts and reaches a predefined threshold value, typically equal to a percentage (such as 120%) of the value measured in a starting condition (for example, from some μΩ to some mΩ)Indeed, the degradation of the joints reduces their sections, with a consequent increase of the measured resistance. Likewise, a current Ie is injected into the terminal Bie+. Assuming that one of the corresponding pads P6 or P2 is short-circuited to one of the pads P12 or P8 on the other row, the same current Ie is sunk from the terminal Bie−. A voltage Ve measured between the associated terminals BVe− and BVe+ then allows calculating a resistance Re=Ve/Ie of the two crossed joints (between the terminals of the capacitor and the relevant pads P6/P2 and P12/P8), so as to obtain an indication of their integrity.

Figure 5A:
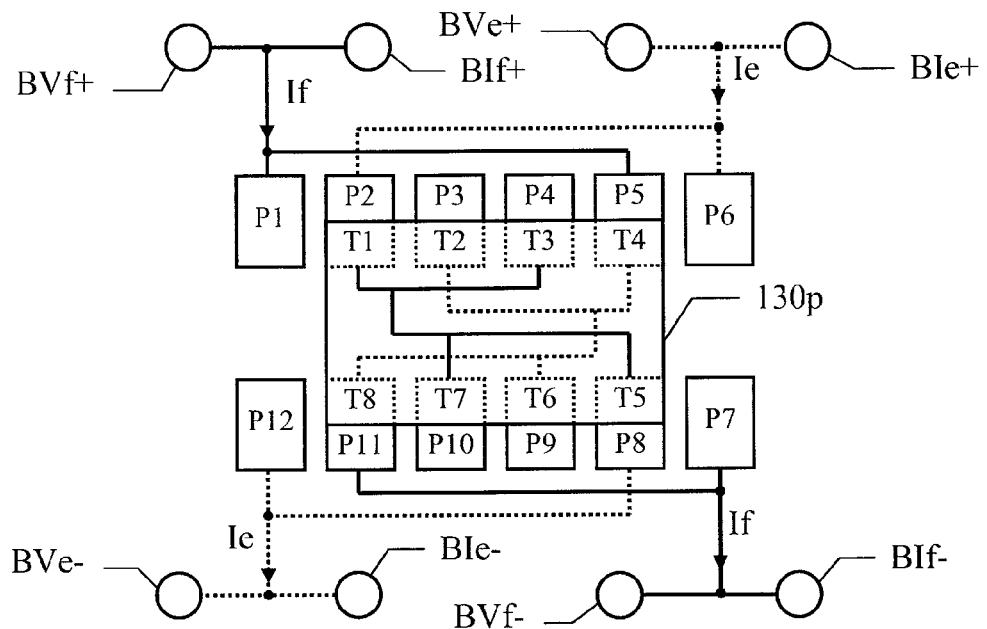
FIGS. 5a-5c illustrate an exemplary application of the solution according to an embodiment of the invention.
Figure 5B:
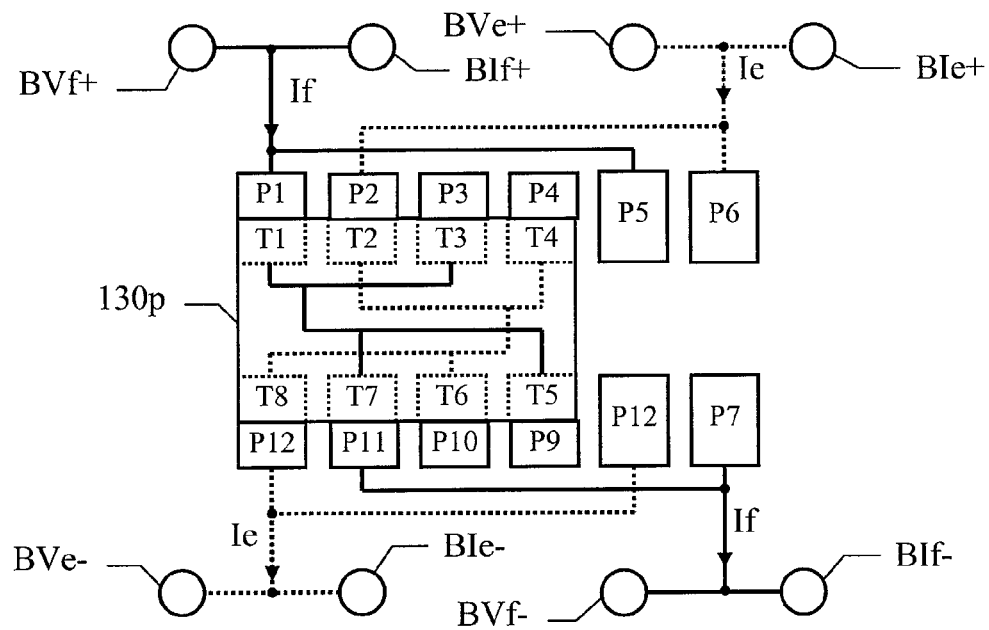
Figure 5C:
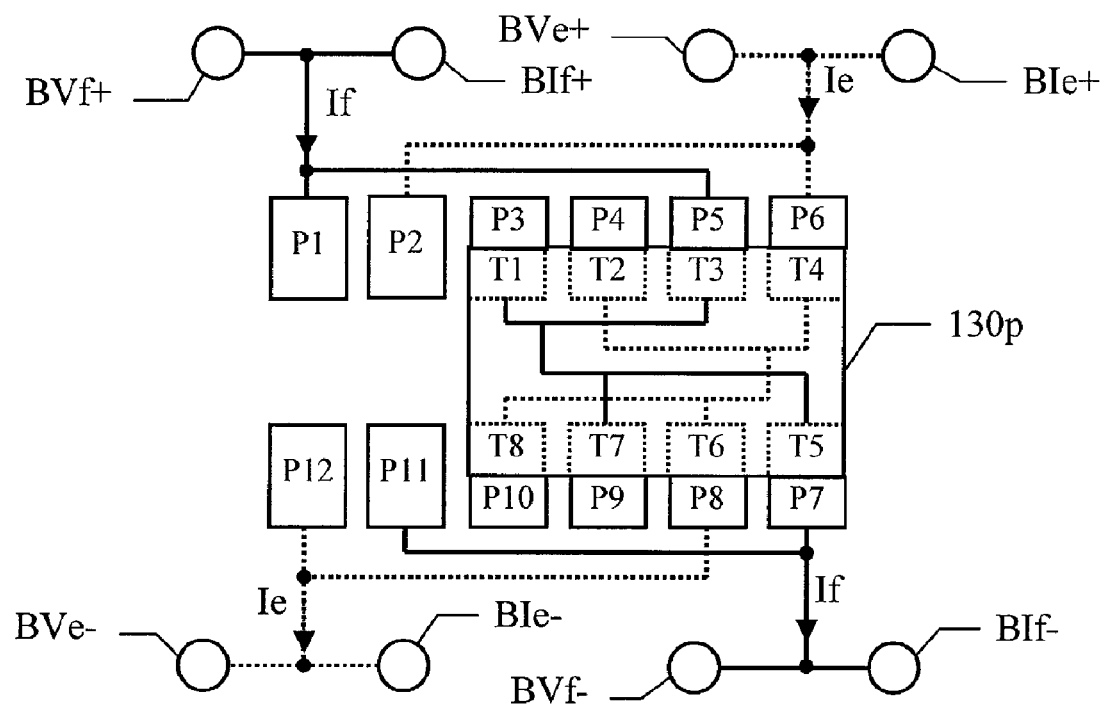

An exemplary application of the above-described structure is illustrated in FIGS. 5a-5c. Particularly, in FIG. 5a the capacitor 130*p* is mounted in a working position based on the manufacturing standards for the gaps with the other components (not shown in the figure). For example, the capacitor 130*p* is placed at 2 mm from an adjacent integrated circuit (to its left) and at 2.5 mm from the stiffener (to its right). In this condition, the capacitor 130*p* is mounted at the center of the pads 110*p*. More specifically, the terminals T1-T4 are connected to the pads P2-P5 (in the upper row), and the terminals T5-T8 are connected to the pads P8-P11 (in the lower row). Therefore, a conductive path is established from the terminal BVf+ to the terminal BVf− through the pad P5, the terminal T4, the terminal T8 and the pad P11. Likewise, another conductive path is established from the terminal BVe+ to the terminal BVe− through the pad P2, the terminal T1, the terminal T5 and the pad P8.

It is then possible to test the integrity of the joints P5/T4 and T8/P11 (as indicated by the resistance Rf=Vf/If), and the integrity of the joints P2/T1 and T5/P8 (as indicated by the resistance Re=Ve/Ie). It should be noted that in this case the test is applied to the most critical joints of the configuration.

Indeed, in the working position any failure of the joints is more likely to appear at the corners of the capacitor 130p (being the closest ones to the adjacent components).

Instead, in FIG. 5b the capacitor 130p is mounted in an advanced position with the gaps with the other components (not shown in FIG. 5b) below the manufacturing standards. In the example at issue, the capacitor 130p is moved to the left so as to be closer to the adjacent integrated circuit (and then more far away from the stiffener). For example, the capacitor 130p is now placed at 1.5 mm from the adjacent integrated circuit (to its left) and consequently at 3 mm from the stiffener (to its right). In this condition, the capacitor 130p is mounted at the left-end of the pads 110p. More specifically, the terminals T1-T4 are connected to the pads P1-P4 (in the upper row). The terminals T5-T8 are connected to the pads P9-P12 (in the lower row). Therefore, a conductive path is established from the terminal BVf+ to the terminal BVf− through the pad P1, the terminal Ti, the terminal T7 and the pad P11. Likewise, another conductive path is established from the terminal BVe+ to the terminal BVe− through the pad P2, the terminal T2, the terminal T8 and the pad P12.

It is then possible to test the integrity of the joints P1/T1 and T7/P11 (as indicated by the resistance Rf=Vf/If), and the integrity of the joints P2/T2 and T8/P12 (as indicated by the resistance Re=Ve/Ie). As above, the test is still applied to the most critical joints of the configuration. Indeed, in the advanced position any failure of the joints is more likely to appear at the left of the capacitor 130p (being the closest ones to the adjacent integrated circuit which gap has been reduced).

At the end, in FIG. 5c the capacitor 130p is mounted in a control position with the gaps with the other components (not shown in FIG. 5c) above the manufacturing standards. In the example at issue, the capacitor 130p is moved to the right so as to be more far away from the adjacent integrated circuit (but closer to the stiffener, being less critical in the specific situation). For example, the capacitor 130p is now placed at 2.5 mm from the adjacent integrated circuit (to its left) and consequently at 2 mm from the stiffener (to its right). In this condition, the capacitor 130p is mounted at the right-end of the pads 110p. More specifically, the terminals T1-T4 are connected to the pads P3-P6 (in the upper row). The terminals T5-T8 are connected to the pads P7-P10 (in the lower row). Therefore, a conductive path is established from the terminal BVf+ to the terminal BVf− through the pad P5, the terminal T3, the terminal T5 and the pad P7. Likewise, another conductive path is established from the terminal BVe+ to the terminal BVe− through the pad P6, the terminal T4, the terminal T6 and the pad P8.

It is then possible to test the integrity of the joints P5/T3 and T5/P7 (as indicated by the resistance Rf=Vf/If), and the integrity of the joints P6/T4 and T6/P8 (as indicated by the resistance Re=Ve/Ie). Again, the test is still applied to the most critical joints of the configuration. Indeed, in the control position any failure of the joints is more likely to appear at the right of the capacitor 130p (being the closest ones to the stiffener which gap has been consequently reduced).

In practice, the test is performed on a population of (identical) prototypes having a configuration with all the capacitors mounted in the working position (such as 300 prototypes), on a population of prototypes having a different configuration with all the capacitors in the advanced position (such as 300), and a population of prototypes having another configuration with all the capacitors in the control position (such as only 100, being this configuration less critical). The prototypes are then subjected to a sequence of thermal cycles, after which the voltages Vf and Ve corresponding to the currents If and Ie for each capacitor are measured. It is then possible to calculate the corresponding resistance Rf and Re, so as to determine the number of joints failing in each population of prototypes (for example, after 100, 200, 300, 500, 1,000 and 2,000 thermal cycles). The results so obtained allow identifying any problem in the reliability of the prototypes. Particularly, it is now possible to identify any critical positions of the capacitors on the carrier.

Figure 6:
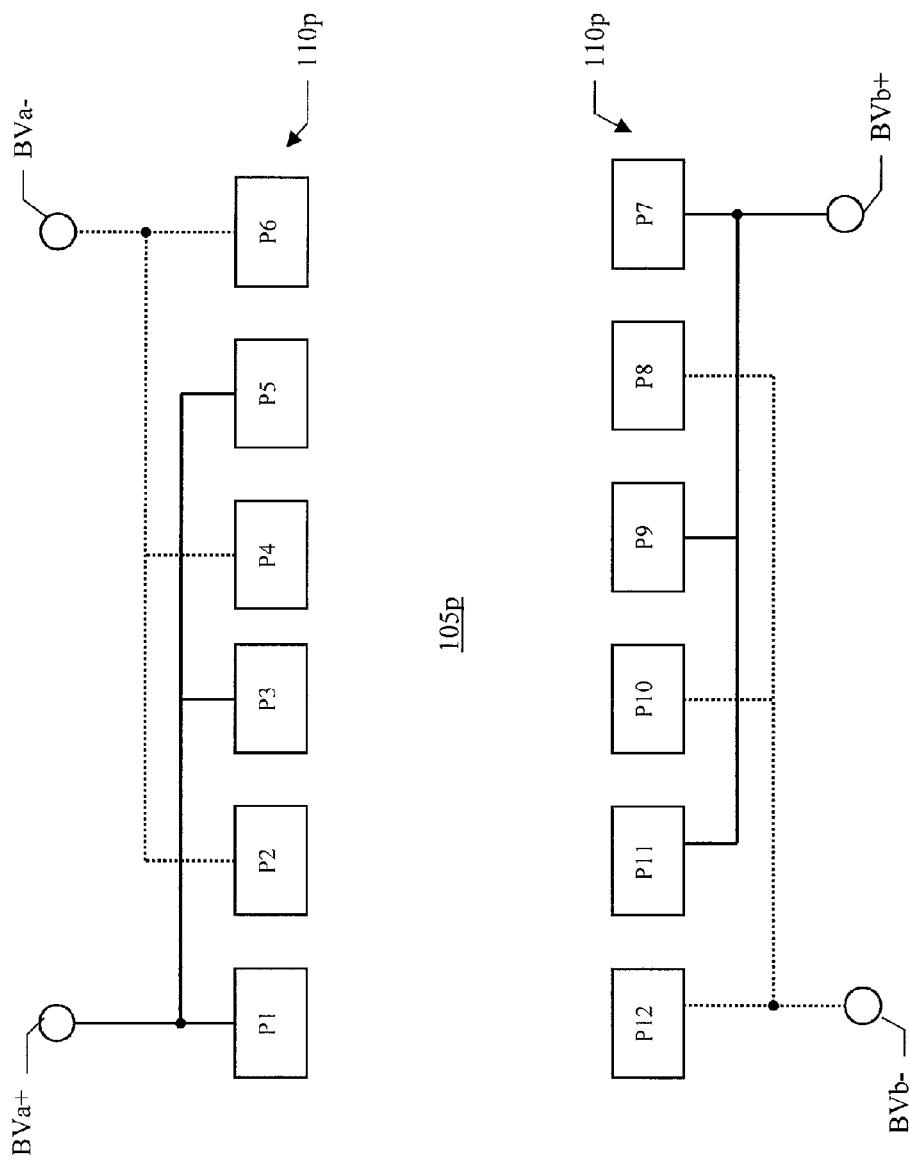
FIG. 6 shows a detail of a carrier of the prototype according to a further embodiment of the invention.

Continuing to FIG. 6, in a different embodiment of the present invention the proposed prototype is used to test the insulation of pairs of adjacent joints between the terminals of each capacitor and the corresponding pads 110p.

In this case, in the upper row all the odd pads P1, P3 and P5 are connected to a common terminal on the back surface of the carrier 105p, individually referred to as Bva+. Symmetrically, all the even pads P2, P4 and P6 are connected to a common terminal on the back surface of the carrier 105p, individually referred to as BVa−. Likewise, in the lower row the even pads P7, P9 and P11 are connected to a common terminal individually referred to as Bvb+. Moreover, the even pads P8, P10 and P12 are connected to a common terminal individually referred to as BVb−.

During the test of the prototype, a positive voltage +V (e.g., 2-5V with respect to a reference voltage or ground) is applied to both the terminals BVa+ and Bvb+. At the same time, a zero or negative voltage −V (e.g., ground) is applied to both the terminals BVa− and BVb−. As can be seen, each pair of adjacent pads P1-P12 always receives different voltages (i.e., +V and −V).

Therefore, when a short circuit is generated between two adjacent pads P1-P12 (for example, due to ionic contamination, electro-migration or dendritic growth), the event can be detected by a current flowing through a measuring instrument connected between the terminals BVa+ and BVa− (or between the terminals BVb+ and BVb−). It is then possible to identify any failure of the insulation between the joints, in response to the reaching of a minimum acceptable resistance (for example, about 1-10 MΩ).

Figure 7A:
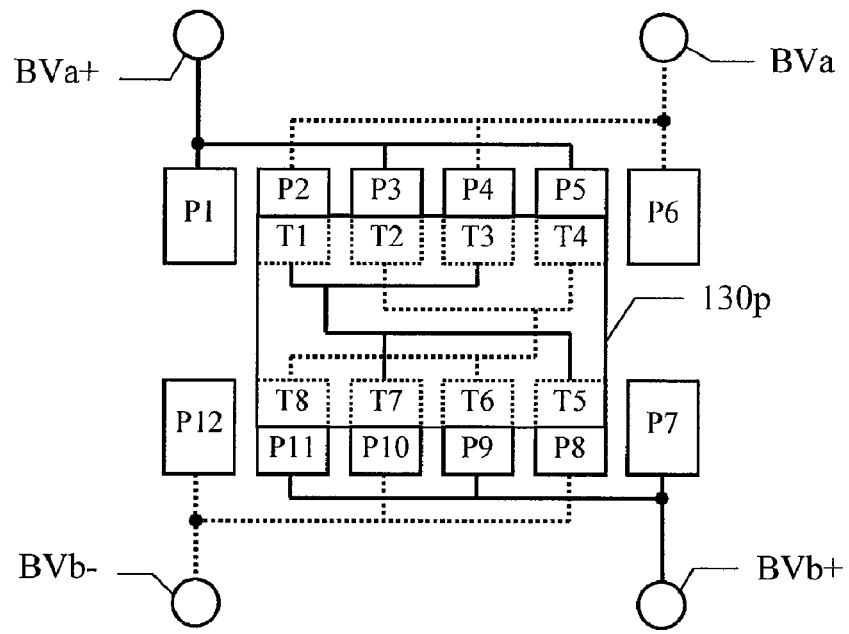
FIGS. 7a-7c illustrate an exemplary application of the solution according to an embodiment of the invention.
Figure 7B:
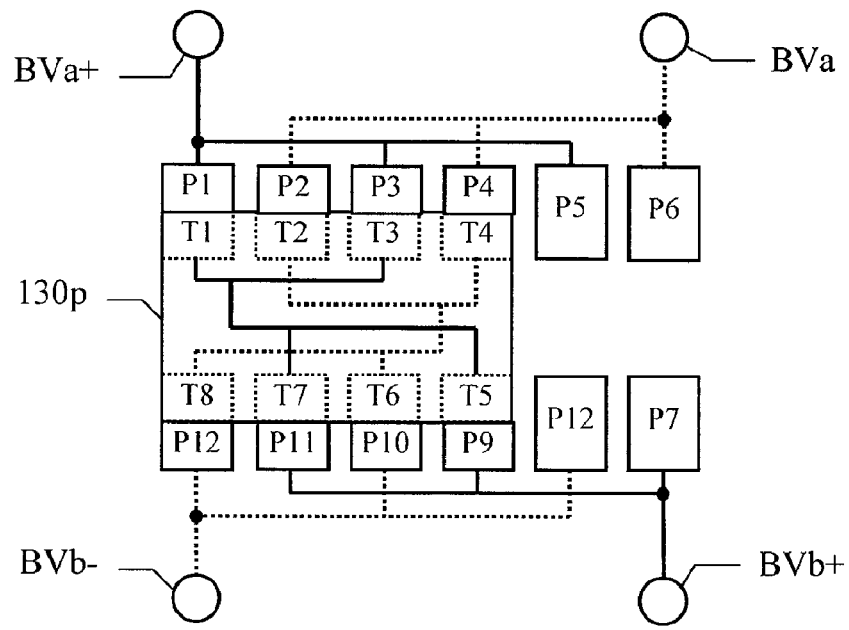
Figure 7C:
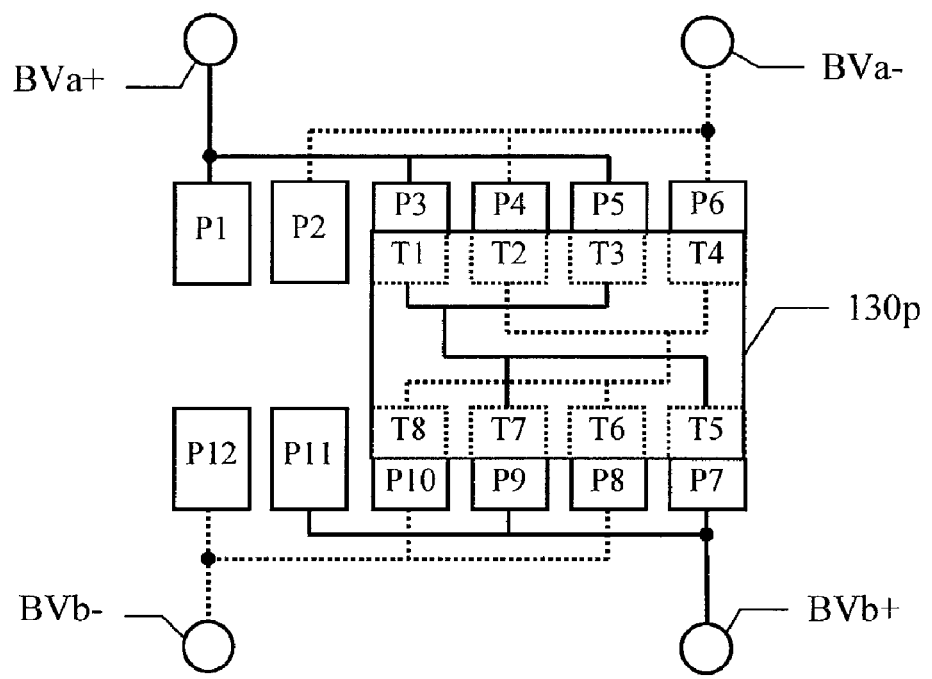

An exemplary application of the above-described structure is illustrated in the FIGS. 7a-7c. Particularly, in FIG. 7a the capacitor 130p is mounted in the working position at the center of the pads 110p (with the terminals T1-T4 connected to the pads P2-P5, and the terminals T5-T8 connected to the pads P8-P11). Therefore, the joints P3/T2, P5/T4, P9/T6 and P11/T8 are short-circuited to each other (within the capacitor 130p), and they are all connected to the terminals BVf+ and Bve+. Likewise, the other joints P2/T1, P4/T3, P8/T5 and P10/T7 are short-circuited to each other (within the capacitor 130p), and they are all connected to the terminals BVf− and BVe−. It is then possible to test the insulation of each pair of adjacent joints. Indeed, when the voltage +V is applied to the terminals BVf+ and BVe+, and the voltage −V is applied to the terminals BVf− and BVe−, a corresponding voltage difference (such as 2-5V) is applied to each pair of adjacent joints (so that any short circuit can be readily detected).

Instead, in FIG. 7b the capacitor 130p is mounted in the advanced position at the left-end of the pads 110p (with the terminals T1-T4 connected to the pads P1-P4, and the terminals T5-T8 connected to the pads P9-P12). Therefore, the joints P1/T1, P3/T3, P9/T5 and P11/T7 are short-circuited to each other, and they are all connected to the terminals BVf+ and Bve+. Likewise, the other joints P2/T2, P4/T4, P10/T6 and P12/T8 are short-circuited to each other, and they are all connected to the terminals BVf− and BVe−. As above, it is still possible to test the insulation of each pair of adjacent joints, since the same voltage difference is applied to each pair of adjacent joints (when the voltage +V is applied to the terminals BVf+ and BVe+, and the voltage −V is applied to the terminals BVf− and BVe−).

At the end, in FIG. 7c the capacitor 130p is mounted in the control position at the right-end of the pads 110p (with the terminals T1-T4 connected to the pads P3-P6, and the terminals T5-T8 connected to the pads P7-P10). Therefore, the joints P3/T1, P5/T3, P7/T5 and P9/T7 are short-circuited to each other, and they are all connected to the terminals BVf+ and Bve+. Likewise, the other joints P4/T2, P6/T4, P8/T6 and P10/T8 are short-circuited to each other, and they are all connected to the terminals BVf− and BVe−. Again, it is still possible to test the insulation of each pair of adjacent joints, since the same voltage difference is applied to each pair of adjacent joints.

In this case as well, the test may be performed, with the same process described in the foregoing, on multiple populations of the prototypes (for the different configurations, wherein the capacitors may have different opportunities of suffering various contamination levels based on the proximity of other components).

Naturally, in order to satisfy local and specific requirements, a person skilled in the art may apply to the solution described above many modifications and alterations. Particularly, although the present invention has been described with a certain degree of particularity with reference to preferred embodiment(s) thereof, it should be understood that various omissions, substitutions and changes in the form and details as well as other embodiments are possible. Moreover, it is expressly intended that specific elements and/or method steps described in connection with any disclosed embodiment of the invention may be incorporated in any other embodiment as a general matter of design choice.

For example, similar considerations apply if the device and the corresponding prototypes have a different structure or include equivalent components (for example, with a stiffening cap, with components wire-bonded to the pads of the carrier, and the like). In any case, the terminals of the components, the pads of the carrier and its terminals may be replaced with any similar elements (even in any other number). Likewise, it is possible to mount whatever number of integrated circuits and/or discrete elements on the same carrier.

Moreover, it is possible to implement carriers supporting a different number of configurations (down to two only). In any case, nothing prevents reusing the same carrier for assembling more prototypes with different configurations.

Although in the preceding description reference has been made to a specific prototyping process, this is not to be interpreted in a limitative manner (with the prototypes that may be tested with different procedures). In any case, the obtained results may also be used for whatever other purpose.

Similar considerations apply if each set of short-circuited pads is connected to a different number of terminals of the carrier; however, a simplified implementation wherein the pads are accessible individually is contemplated.

Moreover, other conductive paths may be established during the test (such as implementing a so-called daisy chain). In any case, the possibility of testing components that do not have their terminals short-circuited, so as to provide the above-described conductive paths, is not excluded (even if in this case the test is limited to the pads of the carrier without taking into account the effects of the components mounted thereon).

It is emphasized that the proposed tests (i.e., the resistance test and the insulation test) are not comprehensive, with the proposed solution that may also be used to perform whatever electrical, thermal and mechanical test on the prototype.

The concepts of the present invention are also suitable to be applied to components having a different structure. For example, when the components have a matrix of terminals they may be moved in two directions on the carrier (i.e., upwards and downwards in addition to leftwards and rightwards).

Although the proposed solution is preferably applied to the discrete elements only, nothing prevents extending the same concepts to the integrated circuits as well.

It should be noted that the configurations of the pads described above (for either the resistance test or the insulation test) are not to be constructed as a limitation of the scope of the present invention (with the same concepts that may also be applied to different applications, for example, involving the test of any other number of terminals of the components).

It should be readily apparent that the proposed carrier may also be created in a programming language. Moreover, if the designer does not fabricate the carrier, the design may be transmitted by physical means to others.

The invention claimed is:

1. A method for using at least one circuitized carrier to prototype an electronic device including the steps of:
   providing a plurality of sets of contacts on the at least one circuitized carrier for electrically connecting terminals of corresponding electronic components, for at least a selected one of the electronic components, a number of corresponding contacts in a set being more than a number of terminals of the at least one selected electronic component;
   assembling a plurality of prototypes of the electronic device by mounting the electronic components on the at least one circuitized carrier, the prototypes having a plurality of configurations each one defined by a position arrangement of the terminals of each selected electronic component for use in mounting on the corresponding contacts; and
   measuring operative parameters of each prototype through the contacts being connected to the terminals of the at least one selected electronic component.

2. The method according to claim 1, further including the steps of:
   selecting one of the configurations according to a result of the measuring step; and
   manufacturing electronic devices corresponding to the selected configuration.

3. The method according to claim 1, wherein, for each selected electronic component, the contacts being connected include at least one measuring set of measuring contacts being connected to at least one common access point of the circuitized carrier, a different subset of the measuring contacts in each measuring set being connected to corresponding terminals of the selected electronic component in each position thereof, and wherein the measuring step is performed through the common access points.

4. The method according to claim 3, wherein, for each selected electronic component, the at least one measuring set consists of a plurality of measuring sets organized in at least one pair, and wherein the terminals of the selected electronic component include at least one coupling set of coupling contacts being short-circuited to each other within the selected electronic component, in each pair of measuring sets at least one measuring contact of each measuring set of the pair being connected to a coupling terminal of the same coupling set in each position of the selected electronic component, and wherein the measuring step includes applying a stimulus signal between corresponding common access points of the measuring sets of each pair.

5. The method according to claim 4, wherein, for each measuring set, the measuring contacts are connected to a first access point and to a second access point, for each pair of measuring sets the measuring step further including:
- applying a predetermined first electrical signal between the first access points of the measuring sets of the pair;
- detecting a second electrical signal between the second access points of the measuring sets of the pair; and
- calculating a value indicative of a resistance of corresponding connections between the coupling terminals and the measuring contacts according to the first electrical signal and the second electrical signal.

6. The method according to claim 4, wherein, for each selected electronic component, the at least one pair of measuring sets includes a first pair and a second pair, each measuring terminal of the first pair being adjacent to at least one measuring terminal of the second pair, and wherein the measuring step further includes:
- applying a first voltage to the access points of the measuring sets of the first pair and a second voltage to the access points of the measuring sets of the second pair;
- measuring a resistance between the access points of the first pair and the access points of the second set; and
- detecting any insulation failure between adjacent measuring terminals according to the measured resistance.

7. The method according to claim 5, wherein the terminals of each selected electronic component are ordered in a sequence along a first row and a second row of even terminals, the at least one coupling set consisting of a first coupling set formed by the terminals in odd positions and a second coupling set formed by the terminals in even positions, wherein the corresponding contacts are ordered in a further sequence along a first further row and a second further row of even terminals.

8. The method according to claim 7, wherein each selected electronic component is a discrete element.

9. The method according to claim 7, wherein, for each selected electronic component, the at least one pair of measuring sets includes a first pair consisting of two measuring sets formed by the first contact and the last but one contact in the first further row and in the second further row, respectively, and a second pair consisting of two measuring sets formed by the second contact and the last contact in the first further row and in the second further row, respectively.

10. The method according to claim 7, wherein, for each selected electronic component, the first pair consists of two measuring sets formed by the contacts in odd positions in the first further row and in the second further row, respectively, and the second pair consists of two measuring sets formed by the contacts in even positions in the first further row and in the second further row, respectively.

11. A circuitized insulating carrier used in prototyping an electronic device comprising:
- a plurality of sets of contacts for electrically connecting terminals of corresponding electronic components, for at least a selected one of the electronic components, a number of corresponding contacts in a set being more than a number of terminals of the at least one selected electronic component; and
- a plurality of prototypes of the electronic device assembled by mounting the electronic components on the circuitized insulating carrier, the prototypes having a plurality of configurations each one defined by a position arrangement of the terminals of each selected electronic component for use in mounting on the corresponding contacts, wherein operative parameters of each prototype are measured through the contacts being connected to the terminals of the at least one selected electronic component.

* * * * *